(12) United States Patent
Green

(10) Patent No.: US 11,227,090 B2
(45) Date of Patent: Jan. 18, 2022

(54) SYSTEM AND METHOD FOR ACHIEVING FUNCTIONAL COVERAGE CLOSURE FOR ELECTRONIC SYSTEM VERIFICATION

(71) Applicant: Michael Alexander Green, San Jose, CA (US)

(72) Inventor: Michael Alexander Green, San Jose, CA (US)

( * ) Notice: Subject to any disclaimer, the term of this patent is extended or adjusted under 35 U.S.C. 154(b) by 0 days.

(21) Appl. No.: 16/880,974

(22) Filed: May 21, 2020

(65) Prior Publication Data

US 2021/0264085 A1    Aug. 26, 2021

Related U.S. Application Data

(60) Division of application No. 15/972,597, filed on May 7, 2018, now Pat. No. 10,699,046, which is a continuation-in-part of application No. 15/898,217, filed on Feb. 15, 2018, now abandoned.

(60) Provisional application No. 62/459,482, filed on Feb. 15, 2017.

(51) Int. Cl.
| | |
|---|---|
| *G06F 30/3323* | (2020.01) |
| *G06N 20/00* | (2019.01) |
| *G06N 3/04* | (2006.01) |
| *G06N 3/08* | (2006.01) |
| *G01R 31/3167* | (2006.01) |

(52) U.S. Cl.
CPC ....... *G06F 30/3323* (2020.01); *G06N 3/0454* (2013.01); *G06N 3/088* (2013.01); *G06N 20/00* (2019.01); *G01R 31/3167* (2013.01)

(58) Field of Classification Search
CPC .. G06F 30/3323; G06N 3/088; G06N 3/0454; G06N 20/00; G01R 31/31704; G01R 31/3167; G01R 31/3177; G01R 31/31724; G01R 31/318364
See application file for complete search history.

(56) References Cited

U.S. PATENT DOCUMENTS

| | | | | |
|---|---|---|---|---|
| 6,275,976 | B1 * | 8/2001 | Scandura | G06F 11/3608 |
| | | | | 714/E11.208 |
| 6,807,535 | B2 * | 10/2004 | Goodkovsky | G09B 7/04 |
| | | | | 706/3 |
| 7,024,660 | B2 * | 4/2006 | Andrade | G06F 30/34 |
| | | | | 717/124 |
| 7,114,111 | B2 * | 9/2006 | Noy | G01R 31/31707 |
| | | | | 714/738 |
| 7,181,376 | B2 * | 2/2007 | Fine | G06F 11/261 |
| | | | | 703/2 |
| 7,203,882 | B2 * | 4/2007 | Fine | G01R 31/31813 |
| | | | | 714/724 |

(Continued)

*Primary Examiner* — Helen Rossoshek
(74) *Attorney, Agent, or Firm* — The Law Office of Herbert T. Patty

(57) ABSTRACT

The present invention is a process by which an engineer can provide as input the design, functional verification goals, and other abstract design details, and receive as output an agent which can be integrated into traditional test benches and will generate stimuli to automatically hit the functional coverage goals for the design. The present invention may employ a system which includes a learning configurator, a pre-trained learning test generator, and a test bench. The pre-trained learning test generator is communicatively coupled to the generator and notably comprises a learning algorithm.

9 Claims, 15 Drawing Sheets

(56) References Cited

U.S. PATENT DOCUMENTS

| | | | |
|---|---|---|---|
| 7,331,007 B2* | 2/2008 | Fine | G01R 31/318357 703/13 |
| 7,496,873 B2* | 2/2009 | Hsieh | G01R 31/318357 716/136 |
| 7,512,912 B1* | 3/2009 | Iyer | G01R 31/318371 716/136 |
| 7,617,468 B2* | 11/2009 | Thakur | G01R 31/31835 716/106 |
| 7,694,253 B2* | 4/2010 | Campos | G06F 30/20 716/106 |
| 7,716,548 B2* | 5/2010 | Cheng | G01R 31/31703 714/729 |
| 7,849,425 B1* | 12/2010 | Hamid | G06F 11/263 716/136 |
| 8,019,586 B2* | 9/2011 | Fournier | G01R 31/31835 703/14 |
| 8,095,344 B2* | 1/2012 | Ghaboussi | G06F 30/23 703/2 |
| 8,924,938 B2* | 12/2014 | Chang | G06F 11/3688 717/128 |
| 9,021,409 B2* | 4/2015 | Vasudevan | G06F 30/3323 716/106 |
| 9,454,457 B1* | 9/2016 | Jan | G06F 11/3664 |
| 9,454,467 B2* | 9/2016 | Wu | G06F 11/3684 |
| 9,665,832 B2* | 5/2017 | Thieberger | G06N 5/046 |
| 10,162,741 B2* | 12/2018 | Kochura | G06N 20/00 |
| 11,017,271 B2* | 5/2021 | Desai | G06K 9/6271 |
| 2002/0138242 A1* | 9/2002 | Wilensky | G06F 30/20 703/13 |
| 2007/0055662 A1* | 3/2007 | Edelman | G06F 40/237 |
| 2007/0299648 A1* | 12/2007 | Levitt | G06F 30/3323 703/22 |
| 2013/0054218 A1* | 2/2013 | Ashraf | G06F 30/33 703/14 |
| 2013/0138428 A1* | 5/2013 | Chandramouli | G06F 40/40 704/9 |
| 2014/0278294 A1* | 9/2014 | Yeager | G06F 30/20 703/2 |
| 2015/0294061 A1* | 10/2015 | Arbel | G06F 30/398 716/112 |
| 2017/0161402 A1* | 6/2017 | Ikram | G06F 30/33 |
| 2017/0270245 A1* | 9/2017 | Rooyen | G16B 20/40 |
| 2018/0089349 A1* | 3/2018 | Rezgui | G06F 30/20 |
| 2018/0114334 A1* | 4/2018 | Desai | G06K 9/4604 |
| 2018/0224502 A1* | 8/2018 | Champoux | G06F 11/27 |
| 2018/0293205 A1* | 10/2018 | Koker | G06N 3/0445 |
| 2018/0293517 A1* | 10/2018 | Browne | G06N 5/04 |
| 2018/0330194 A1* | 11/2018 | Peng | G06N 3/04 |
| 2019/0126472 A1* | 5/2019 | Tunyasuvunakool | G06N 3/0454 |
| 2019/0163618 A1* | 5/2019 | Akiona | G06F 11/3684 |
| 2019/0209022 A1* | 7/2019 | Sobol | A61B 5/7435 |
| 2020/0187841 A1* | 6/2020 | Ayyad | A61B 5/377 |
| 2020/0193227 A1* | 6/2020 | Zhou | G06T 3/4046 |
| 2020/0197818 A1* | 6/2020 | Ma | A63F 13/2145 |

* cited by examiner

SYSTEM AND METHOD FOR ACHIEVING FUNCTIONAL COVERAGE CLOSURE FOR ELECTRONIC SYSTEM VERIFICATION

PRIORITY

The present patent application claims priority to U.S. provisional patent application No. 62/459,482 filed Feb. 15, 2017 in accordance with 35 U.S.C. 119(e)(1), a continuation-in-part of U.S. non-provisional patent application Ser. No. 15/898,217 filed Feb. 15, 2018 in accordance with 35 U.S.C. 120, and a divisional patent application of U.S. non-provisional patent application Ser. No. 15/972,597 filed May 7, 2018 in accordance with 35 U.S.C. 120.

FIELD OF THE INVENTION

The present invention relates to a design under test, and more specifically to a system and method for achieving functional coverage closure for electronic system verification.

BACKGROUND

Modern electronic systems are becoming more complex and market pressure demands that these complex systems are developed and brought to high-volume production within shorter timelines. These trends demand the development of tools and processes that create greater efficiency in electronics systems development.

A typical step in the process of bringing modern electronics systems profitably into production is performing functional verifications of designs. Functional verification is the process by which an electronics system design at some level of abstraction is tested to ensure that a design when manufactured will function according to the intent of the designer.

The functional verification process includes a process to achieve functional coverage closure. Functional coverage closure is achieved when the designer can prove that all of the intended verification goals (i.e., functional coverage goals) have been achieved by one or more test scenarios developed by the designer or some other engineer who understands the functionality of the electronic system.

Today's functional coverage closure is performed manually by an engineer that writes the coverage goals and then manually writes the tests based on their understanding of the design and how it will process the tests. The engineer also manually runs the tests, collects coverage goal hit/miss information, analyzes the resultant information, and then finally adjusts the tests in an attempt to achieve previously un-hit coverage goals in the next round of testing. This process is repeated until all required verification goals have been achieved.

Recent studies suggest that engineers spend approximately 70% of their effort on verification which has more than doubled from 30% within five years. Cost are rising for a variety of electronic systems and now even applies to FPGA-based electronic systems which in the past could be easily and inexpensively re-programmed after productization to resolve late-discovered defects.

U.S. Pat. No. 7,181,376 (the '376 patent) discloses an apparatus and method for employing coverage directed tests which includes a coverage directed test generation (CDG) engine that comprises a data analyzer which analyzes coverage data from a current test run of a test verification system and from previous test runs to determine which coverage events from a coverage model have occurred therein, at what frequency and which ones have not yet occurred; a coverage model listing coverage event which defines the goal of the test verification system; a Bayesian network which determines input data to the test verification system to achieve at least some of the coverage events; and a task manager coupled to the data analyzer and the Bayesian network which refers to the coverage model and queries the Bayesian network to produce input data to achieve desired coverage events. However, the system disclosed in the '376 patent relies upon supervised learning using a Bayesian learning based approach which does not scale as the complexity of the design increases. Moreover, the system disclosed in the '376 patent relies on purely random generation or human intervention to constrain the random generation of stimulus to feed its learning algorithm.

U.S. Pat. No. 7,331,007 (the '007 patent) discloses a method of harnessing machine learning to improve the success rate of stimuli generation. The '007 patent discloses a method for functional verification of an electronic systems design, comprising identifying a feasible space of initial state vectors that can enable generation of stimuli for the design; sampling the feasible space to obtain a sample pool of initial state vectors; generating test stimuli to stimulate the design using respective members of the sample pool; evaluating results of an application of the test stimuli; responsively to the step of evaluating, establishing a subspace of the feasible space, the subspace comprising favorable initial state vectors; and selecting new initial state vectors from the subspace for use in generating functional tests for the design.

Notably, the invention disclosed in the '007 patent requires a human to list constraints to feed into a Constraint Satisfaction Problem (CSP) based random stimulus generator. In order for the self-checking tests to be effective, the invention disclosed in the '007 patent assumes that given an assignment of the state vector, the generation success of any transaction is independent of any other transaction. Moreover, in order for the invention in the '007 patent to be effective, a system employing this invention needs a set of transactions that are comprehensive enough to serve as building blocks for the stimuli desired to be generated, an upper bound to the number of bits in the domain of each gate, an upper bound to the number of gates that form any of the Boolean functions, and a membership query (MQ) oracle capable of producing a correct label indicating successes or failure for any transaction given a possibly incomplete state vector assignment. Furthermore, the invention disclosed in the '007 patent requires a training set of samples which includes a sufficient amount of labeled data.

U.S. Pat. No. 7,849,425 (the '425 patent) discloses a method for generating a test case, the method comprising: generating, by a processor coupled to a test bench configured to execute a test plan on a design under test, a first test case for the design under test (DUT), the generating the first test case comprising traversing a first path through a hierarchy of goals from a start goal to an end goal; wherein a first parent goal traversed in a first level of the hierarchy of goals comprises a first definition of one or more of a slot and a method; and traversal of the first parent goal results in executing an action associated with the first parent goal and subsequently selecting a child goal of the first parent goal for evaluation; and assuming the first definition of the slot or the method by a child goal in a second level of the hierarchy of goals, if the child goal requires the slot or the method; wherein the assuming the first definition of the slot or method comprises searching the first path upstream to the first parent goal for the first definition of the slot or method. A system employing the invention in the '425 patent requires the user to create a graph to constrain the stimulus generation process.

U.S. Pat. No. 9,454,457 (the '457 patent) discloses a software test apparatus and a software test method and a computer readable medium thereof. The software test apparatus stores a software testing program, an under-tested code, a plurality of basic test benches and a plurality of candidate test benches. The under-tested code includes a hard-to-detect code and the hard-to-detect code has at least one hard-to-detect section. The software test apparatus runs the software testing program to execute a plurality of following operations such as parsing the hard-to-detect code to generate a condition-statement tree; based on the basic test benches and the condition-statement tree, using a support vector machine (SVM) to establish a support vector regression (SVR) predictor; and applying the SVR predictor to choose a best candidate test bench from the candidate test benches.

Notably, the invention disclosed in the '457 patent requires the use of a support vector machine (SVM), a strictly supervised learning process that leaves the system susceptible to the curse of dimensionality which states that in order for a learning algorithm to work, the amount of training data must grow exponentially with the addition of each feature or dimension of the problem. However, the increase in training data also increases the training time required for the algorithm, and at some point, when the dimensionality reaches a certain level, training cannot be feasibly achieved. The disclosed invention also requires parsing the hard-to-detect code without describing the manner in which this is done. Moreover, although the '457 patent discloses the use of plurality of candidate test benches, it fails to describe an effective way to generate these candidate test benches.

U.S. Pat. No. 9,454,467 (the '467 patent) discloses a method and apparatus for mining test coverage data. In particular, the '467 patent discloses a method of mining test coverage data, which includes at a device having one or more processors and memory, sequentially processing each of a plurality of coverage data files that is generated by executing the program using a respective test input of a plurality of test inputs, where the processing of each current coverage data file extracts respective execution counter data from the current coverage data file; after processing each current coverage data file, determining whether the respective execution counter data extracted from the current coverage data file includes a predetermined change relative to the respective execution counter data extracted from previously processed coverage data files. In response to detecting the predetermined change for the current coverage data file, including the respective test input used to generate the current coverage data file in a test input collection for testing the program.

The invention disclosed in the '467 patent also employs the use of a simple data mining technique that is not a learning-based approach to reaching coverage closure but is rather a manner to rate a list of pre-generated tests to achieve an efficient list of tests to run to reach a pre-determined coverage goal. Although the invention disclosed in the '467 patent claims to work best when each test input represents a respective unique combination of various parameter values, configurations, and input data, the '467 patent fails, however, to describe the manner to obtain this list of test inputs.

Resources required for chip design verification have increased tremendously over the last several years. This trend is expected to continue. As such, a need exists for an effective design verification system that meets the growing demand for future complex electronic systems. The present invention addresses this need.

SUMMARY OF THE PRESENT INVENTION

The present invention is a process by which an engineer can provide as input an electronic system design, functional verification goals, and other abstract design details, and output an agent which can be integrated into a conventional test bench that generates stimuli to automatically achieve functional coverage goals for an electronic systems design.

Advantageously, one employing the present invention will have a list of tests that can consistently achieve all functional coverage goals. In the event that a design is changed, the process can be performed again to achieve new coverage goals.

BRIEF DESCRIPTION OF THE DRAWINGS

To facilitate understanding, identical reference numerals have been used, wherever possible, to designate identical elements that are common to the figures. The drawings are not to scale and the relative dimensions of various elements in the drawings are depicted schematically and not necessarily to scale. The techniques of the present invention may readily be understood by considering the following detailed description in conjunction with the accompanying drawings, in which.

DETAILED DESCRIPTION

Figure 2:
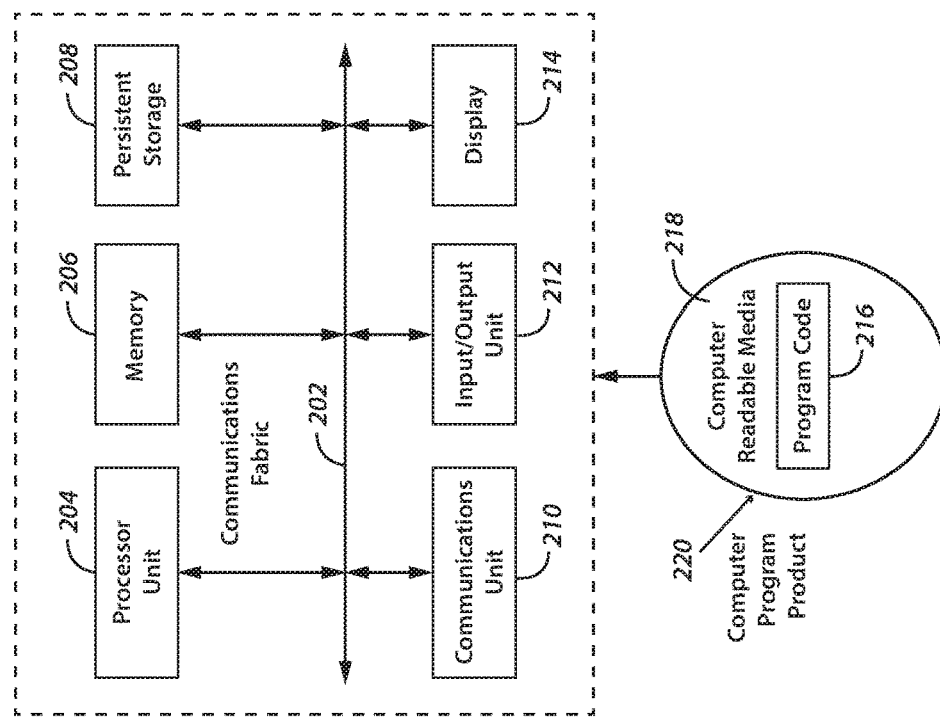
FIG. 2 is a block diagram of a data processing system in which illustrative embodiments may be implemented.

The description of the different advantageous embodiments has been presented for purposes of illustration, and is not intended to be exhaustive or limited to the embodiments in the form disclosed. Many modifications and variations will be apparent to those of ordinary skill in the art. Further, different advantageous embodiments may provide different advantages as compared to other advantageous embodiments. The embodiment or embodiments selected are chosen and described in order to best explain the principles of the embodiments, the practical application, and to enable others of ordinary skill in the art to understand the disclosure for various embodiments with various modifications as are suited to the particular use contemplated.

Before the present invention is described in detail, it is to be understood that, unless otherwise indicated, this disclosure is not limited to specific procedures or articles, whether described or not. It is further to be understood that the terminology used herein is for the purpose of describing particular embodiments only and is not intended to limit the scope of the present invention.

It must be noted that as used herein, and in the claims, the singular forms "a," and "the" include plural referents unless the context clearly dictates otherwise.

Where a range of values is provided, it is understood that each intervening value, to the tenth of the unit of the lower limit unless the context clearly dictates otherwise, between the upper and lower limit of that range, and any other stated or intervening value in that stated range, is encompassed within the disclosure. The upper and lower limits of these smaller ranges may independently be included in the smaller ranges, and are also encompassed within the disclosure, subject to any specifically excluded limit in the stated range. Where the stated range includes one or both of the limits, ranges excluding either or both of those included limits are also included in the disclosure. The term "about" generally refers to ±10% of a stated value.

As will be appreciated by one skilled in the art, the present invention may be embodied as a system, method or computer program product. Accordingly, the present invention may take the form of an entirely hardware embodiment, a software embodiment (including firmware, resident software, micro-code, etc.) stored in a storage device, or an embodiment combining software and hardware aspects that may all generally be referred to herein as a "circuit," "module," or "system." Furthermore, the present invention may take the form of a computer program product embodied in any storage device having computer readable program code embodied in the medium. A storage device for storing computer readable program code does not encompass a signal propagation media such as copper cable, optical fiber or wireless transmission media.

Any combination of one or more computer-readable storage device may be utilized. The computer-readable storage device may be, for example but not limited to, an electronic, magnetic, optical, electromagnetic, infrared, or semiconductor system, apparatus, or device. More specific examples (a non-exhaustive list) of the computer-readable storage device may include the following: a portable computer diskette, a hard disk, a random access memory (RAM), a read-only memory (ROM), an erasable programmable read-only memory (EPROM or flash memory), a portable compact disc read-only memory (CDROM), an optical storage device, or a magnetic storage device processed in a suitable manner, if necessary, and then stored in a computer memory. In the context of this document, a computer-usable or computer-readable medium may be any medium that can contain, store, communicate, propagate, or transport the program for use by or in connection with the instruction execution system, apparatus, or device. The computer-usable medium may include a propagated data signal with the computer-usable program code embodied therewith, either in baseband or as part of a carrier wave. The computer-usable program code may be transmitted using any appropriate medium, including but not limited to wireless, wireline, optical fiber cable, RF, etc.

Computer program code for carrying out operations of the present invention may be written in any combination of one or more programming languages, including an object-oriented programming language such as Java™, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

The present invention is described below with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer program instructions.

These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer program instructions may also be stored in a computer-readable medium that can direct a computer or other programmable data processing apparatus to function in a particular manner, such that the instructions stored in the computer-readable medium produce an article of manufacture including instruction means which implement the function/act specified in the flowchart and/or block diagram block or blocks.

The computer program instructions may also be loaded onto a computer or other programmable data processing apparatus, such as but not limited to an expansion card such as a computer expansion card (e.g., memory expansion card or personal computer card) to cause a series of operational steps to be performed on the computer or other programmable apparatus to produce a computer implemented process such that the instructions which execute on the computer or other programmable apparatus provide processes for implementing the functions/acts specified in the flowchart and/or block diagram block or blocks.

Figure 1:
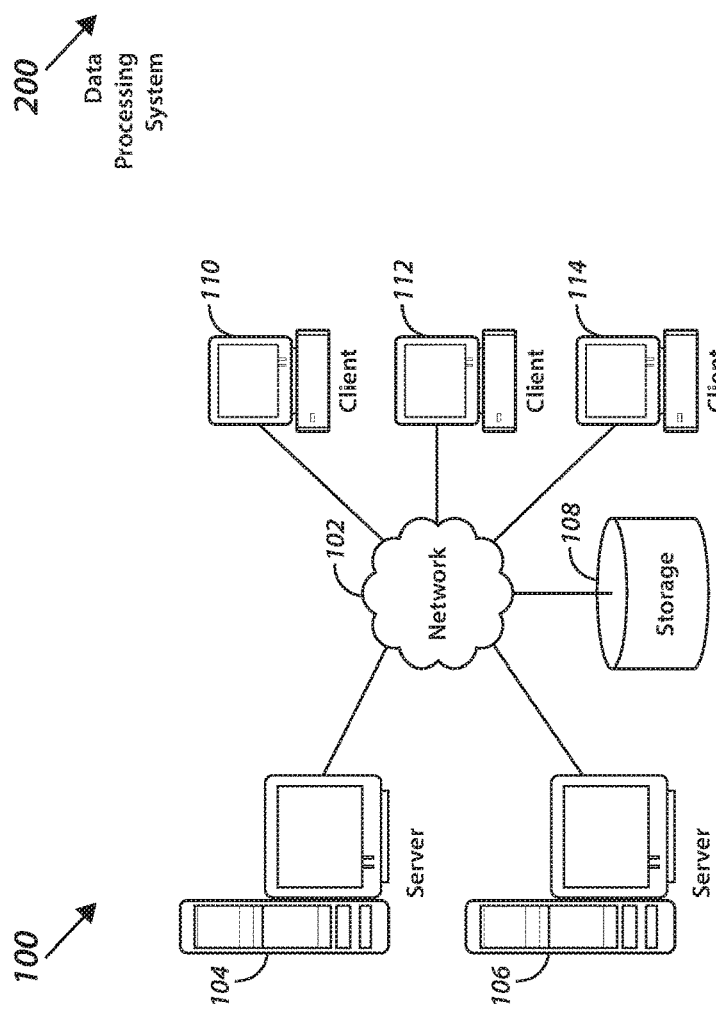
FIG. 1 is an exemplary computer network of data processing systems in which illustrative embodiments may be implemented.

With reference now to the figures and in particular with reference to FIGS. 1-2, exemplary diagrams of data processing environments are provided in which illustrative embodiments may be implemented. It should be appreciated that FIGS. 1-2 are only exemplary and are not intended to assert or imply any limitation with regard to data processing environments in which different illustrative embodiments may be implemented. Many modifications to the depicted environments may be made.

The present invention relates to a design under test, and more specifically, a system and method for achieving functional coverage closure. A system described herein may be implemented pre-silicon (e.g., before fabrication of a new chip design). However, one having ordinary skill in the art may appreciate that the present invention may be applied to other electronic systems such as an embedded system which comprises several chips assembled onto a logic board.

The present invention employs a learning test generator to read coverage goals. The coverage goals may be formatted in any standard manner such as, but not limited to, System-Verilog Cover Groups, SystemVerilog assertions/cover properties, etcetera. A learning test generator consistent with the present invention may read in a synthesizable Register Transfer Level (RTL) design and may perform a formal analysis of the design.

The learning test generator may be configured to train itself based on the inputs generated by the formal analysis engine, the outputs generated as a result of those inputs, and whether or not the coverage goals are met. After the training goal is achieved, a plurality of tests are generated and then integrated into the Design Under Test (DUT) simulation to achieve coverage of all goals. Herein, reference to any combination of the aforementioned coverage goals can be referred to as verification goals, or functional coverage goals, coverage goals, or simply test goals.

The present invention makes further use of prior sets of regression results which leverages work done in the past without the need for expert results to be generated on-the-fly. In addition, the present invention can also use either a formal engine or a simulation engine to execute the stimulus from the generator. Moreover, the present invention includes a straight forward implementation of Generative Adversarial Imitation Learning (GAIL) and could make use of other generative learning processes.

As should be understood by those having ordinary skill in the art, the present invention is not limited to any specific learning process. For example, the present invention may employ a learner which utilizes an inverse reinforcement learning, behavioral cloning, or some other generative adversarial learning process that can converge onto a policy (e.g., set of state/action pairs) used to stimulate a DUT to achieve a set of functional coverage goals.

The present invention may be used in other applications. For example, the present invention can be used to identify defects in an electronics system. In addition, the present invention may be employed to predict the performance of an electronics system design (e.g., automatic benchmarking) or find an optimal performance or power trade-off given other constraints or goals. Moreover, the present invention can be used to discover how to best create routes to connect various components of an electronic system either on a chip, an interposer or other wafer scale or wafer level technology, or on a PCB provided as goals timing constraints, area constraints, or other design rules given to the system.

Notably, the present invention employs a system that incorporates a learning test generator, formal analysis engine (or simulator), learner, and learning process to automate what is presently regarded as a labor-intensive and error-prone process.

A learning test generator may be defined as a GAIL generator while being trained whereas it functions as a conventional reinforcement agent after it has been trained. The learning test generator may employ any suitable learning algorithm. For example, the learning test generator may be employed as a neural network learning algorithm. In addition, the present invention may employ a reinforcement learning algorithm, support vector machine models, Bayesian learning algorithms, regression learning algorithms, and other suitable learning algorithms known in the art.

A formal engine or simulator is a standard HDL/objected oriented code formal analysis engine or simulator. A learner may be defined as a GAIL discriminator. Herein, a learning process is a GAIL process as known in the art.

Figure 3:
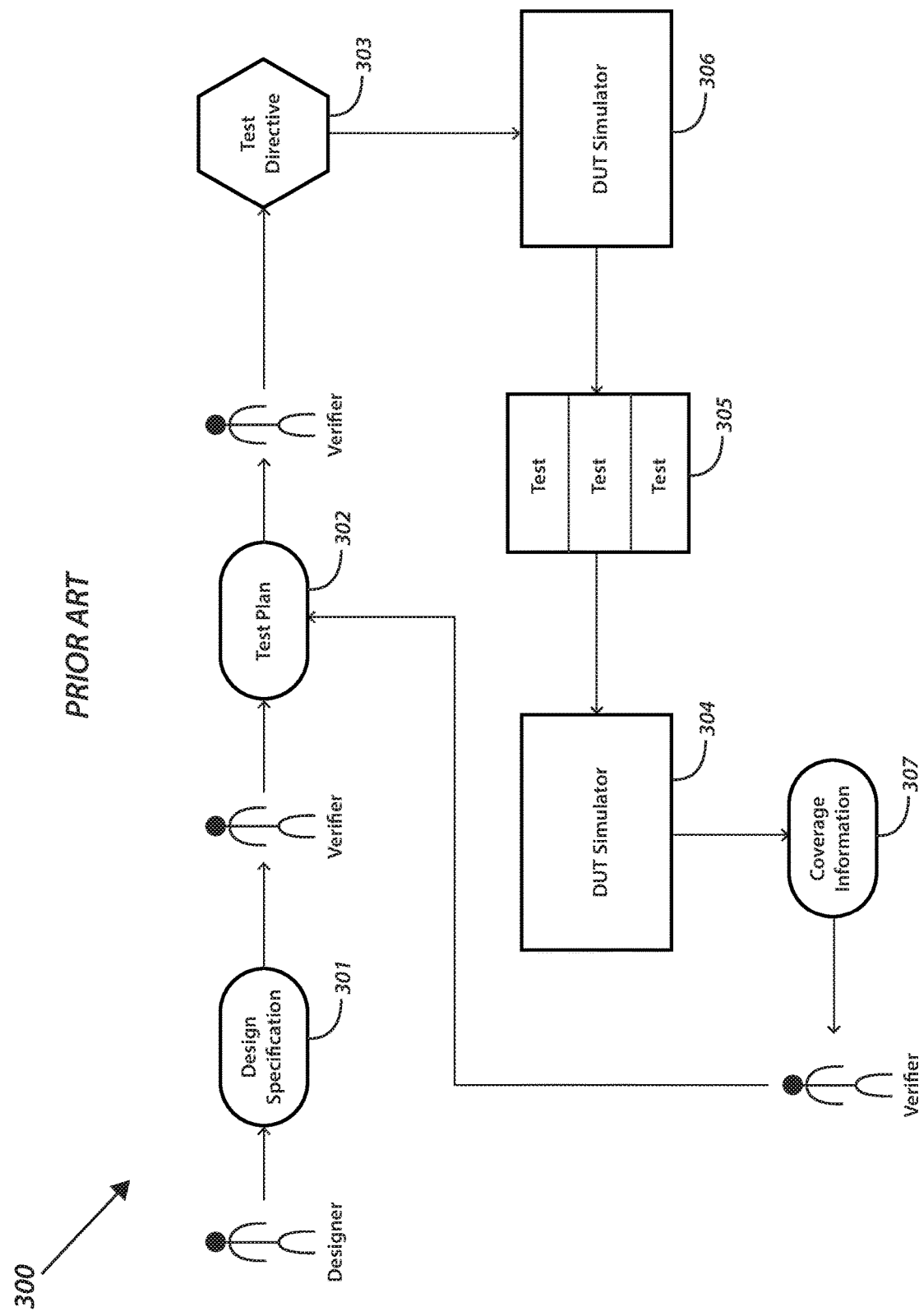
FIG. 3 is a prior art verification process.

FIG. 3 is a prior art verification process illustrating a diagram of a prior art verification flow. Prior art verification processes generally require verification personnel (e.g., verifiers) to generate new test directives based upon the coverage information outputted from the DUT simulator. This process may iterate several times until the coverage goals are met for a particular design. Unfortunately, prior art verification processes include manual inputs which may present challenges for increasingly complex designs.

Figure 4:
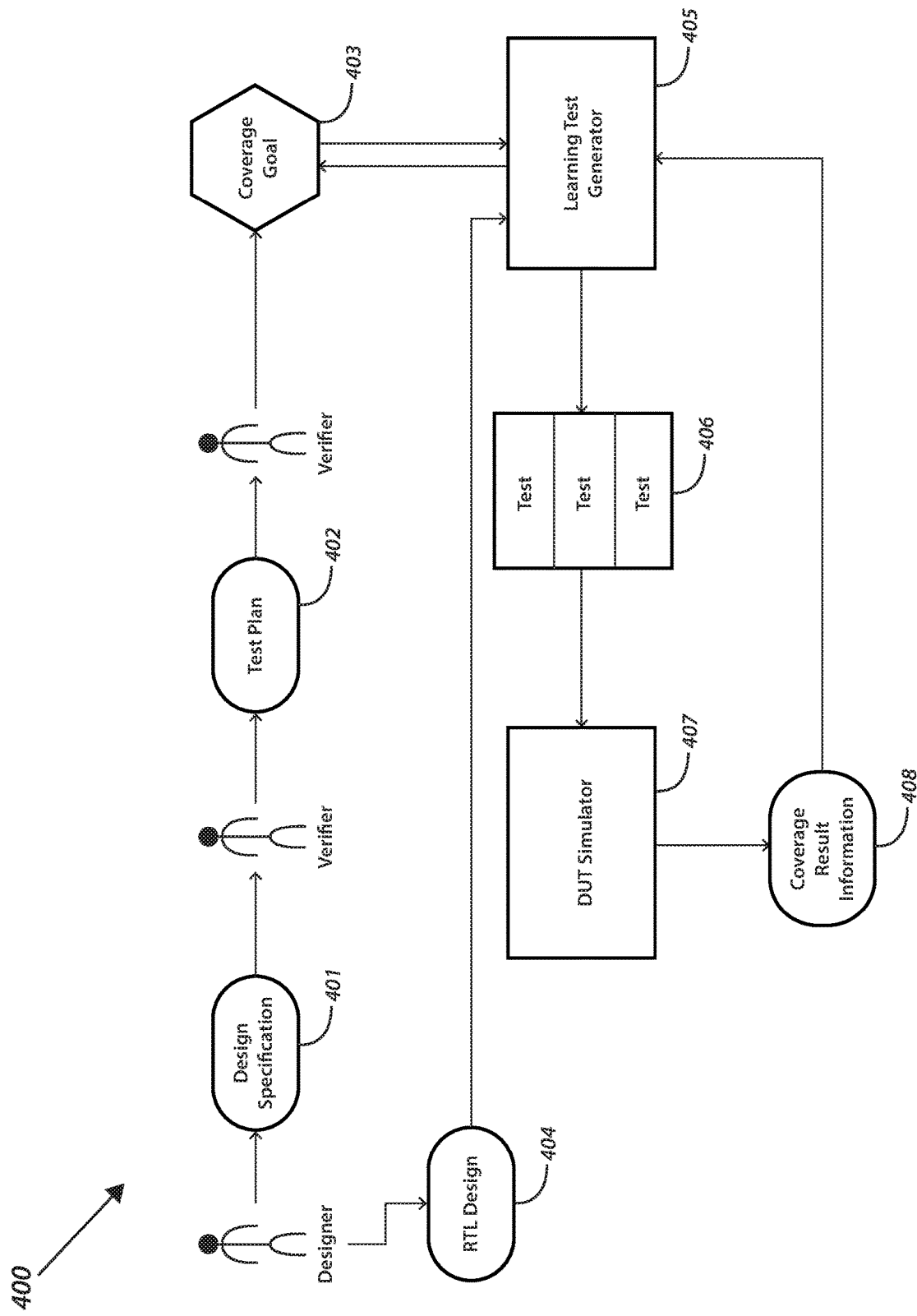
FIG. 4 is an exemplary embodiment of a verification process which implements a learning test generator in a manner consistent with the present invention.

FIG. 4 is an exemplary embodiment of a verification process which implements a learning test generator. The learning test generator can automatically generate tests based on its prior training and new coverage goals. Advantageously, the learning test generator eliminates the need for manual intervention from verifiers as the system progressively generates better tests to achieve the new coverage goals.

Notably, the test directives employed in prior art systems are replaced with coverage goals which are fed into the learning test generator. In some embodiments of the present invention, the learning test generator automatically generates tests based on its training as described below to automatically achieve an individual or set of coverage goals. In addition, a register-transfer level (RTL) design is also given as input into the learning test generator which may influence the tests that are generated by the learning test generator. After the tests are simulated (e.g., by the DUT simulator), coverage result information may be obtained.

The learning test generator can function as both a generator in the GAIL-based training mode and a conventional RL-based agent to generate stimuli in a simulation environment. For example, in some embodiments, while the learning test generator is being trained, the generator application operates as a traditional GAIL-based generator. Likewise, after the learning test generator has been trained and is generating stimuli in a simulation environment, the generator application behaves as a conventional reinforcement learning agent.

There are many different neural networks that could govern the operation of the learning test generator as it is being trained. For example, there are a family of de-convolutional neural networks (DNN) that serves as suitable implementation choices.

There are many different reinforcement learning algorithms which can govern the operation of the post-GAIL trained agent. Exemplary reinforcement learning algorithms include, but are not limited to temporal difference learning algorithms such as Q-learning and state-action-reward-state-action (SARSA). It should be understood by those having ordinary skill in the art that the aforementioned learning algorithms are exemplary and the present invention is therefore not limited thereto.

Figure 5:
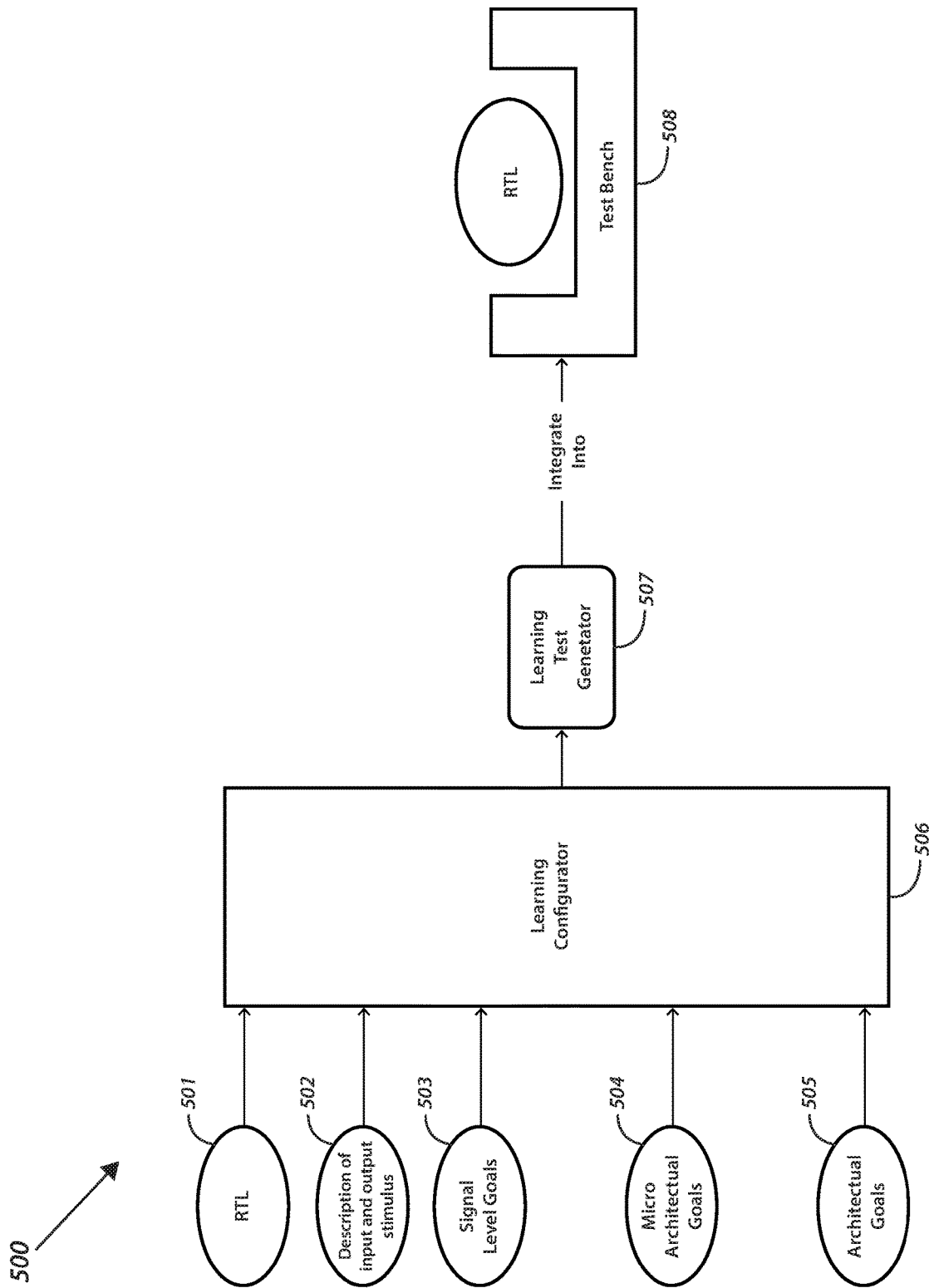
FIG. 5 is a depiction of an exemplary embodiment of the present invention.

FIG. 5 is a depiction of an exemplary embodiment of the present invention. As depicted, during a training process, the learning configurator block is coupled to the learning test generator (i.e., model) to receive information related to training data (e.g., DUT inputs and/or outputs) and associated coverage goals. The learning test generator model can generate tests to be run on a standard test bench known in the art.

After the system is trained, the learning test generator can generate tests to achieve various coverage goals for electronic systems design. FIG. 5 illustrates an overall flow of a manner in which the learning configurator takes as input a RTL design, signal level goals, microarchitectural goals, and architectural goals. The learning configuration then processes them using a learning process implemented by a learning test generator.

In addition, an indication is made as to which subset of functional coverage goals should be used in the training process. As shown, after the learning process has completed it can be integrated into a conventional test bench. In the test bench, stimuli can be generated to achieve a plurality of verification goals as part of a conventional HDL event-driven or cycle-based simulation.

As known by those having ordinary skill in the art, any combination of the signal level goals, microarchitectural goals, and architectural goals can be provided as input. For example, a valid set of verification goals can be comprised of only signal level goals, or a combination of signal level and architectural goals.

Figure 6:
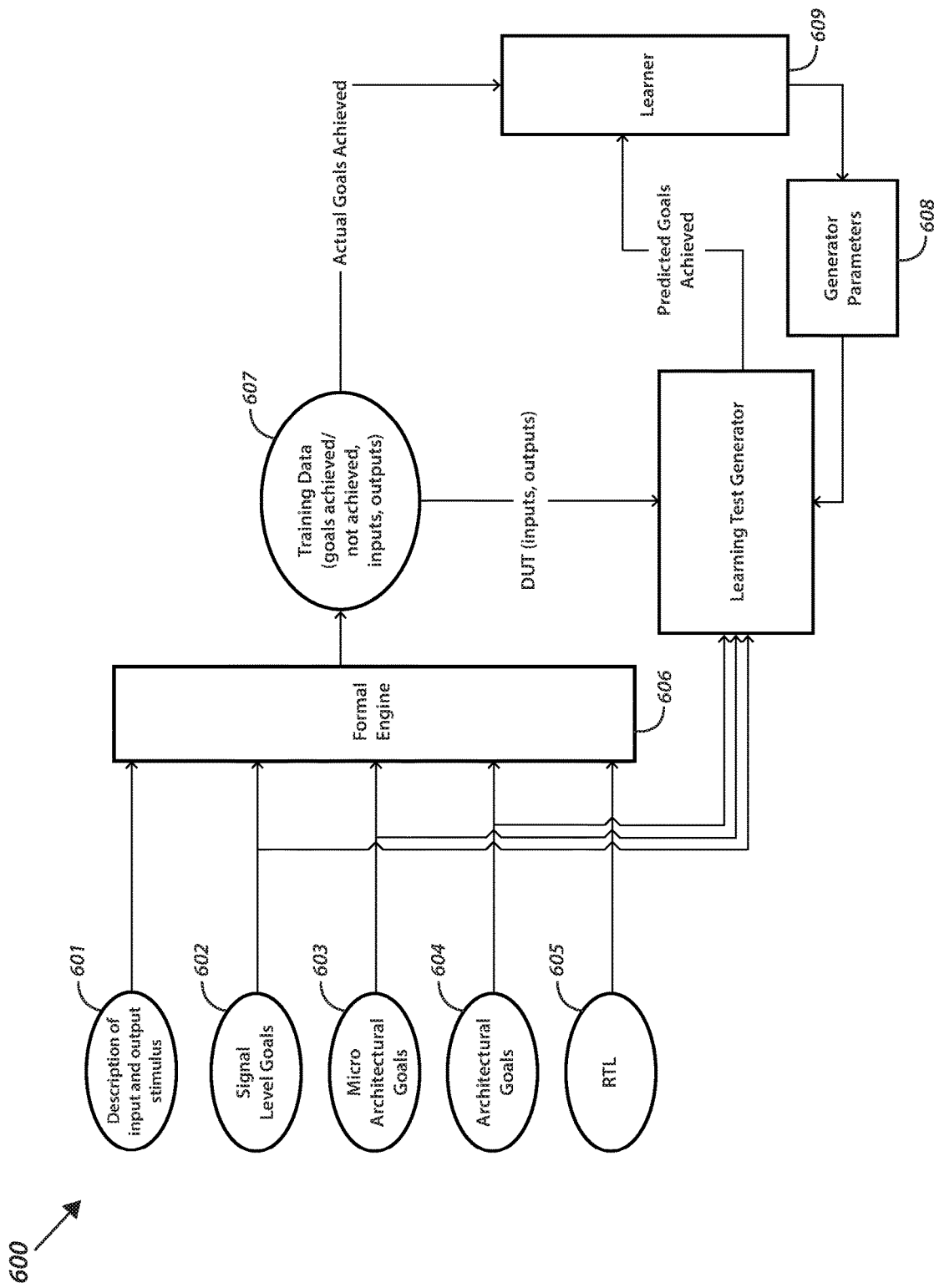
FIG. 6 is an illustration of the learning process according to one embodiment of the present invention.

FIG. 6 is an illustration of a learning process according to one embodiment of the present invention. Advantageously, the learning configurator can be used to automate a training process such that the learning test generator can generate tests to achieve new coverage goals for a particular design. The figure further illustrates an exemplary internal structure of the learning configurator.

In one embodiment of the present invention, the learning configurator receives and analyzes the aforementioned inputs via a formal engine. The formal engine performs a formal analysis and outputs training data. The training data may comprise input stimulus (e.g., the inputs) to the design under test (DUT) or alternatively a RTL design. The training data may also comprise corresponding outputs that the RTL generates in response to the input stimulus and an indication of whether any of the predetermined goals were actually achieved.

During a training mode, the learning test generator receives as input a subset of training data (e.g., DUT inputs and outputs) and the verification goals, and predicts which, if any, of the verification goals should be achieved as a consequence of the input received. Accordingly, during the learning process, both the learning test generator and the learner updates via a change in the generator parameters for the learning test generator and the learning parameters in the learner, to more accurately predict goals (i.e., from the learning test generator) and discriminate (i.e., learner) between predicted goals and goals actually achieved.

The learner takes a different subset of training data (e.g., the actual goals achieved), along with the predicted goals achieved from the learning test generator and performs the GAIL learning process to adjust the relevant parameters controlling the prediction mechanism of the learning test generator and the learner itself. In some embodiments, the generator parameters are parameters that drive the internal policy that the learning test generator follows in performing its predictions of which verification goals are met as a consequence of any series of input/output combinations.

The formal engine may be a conventional formal analysis engine known in the art. The formal engine may be configured to take the DUT, verification goals, and an object-oriented description of the stimulus and responses and converts these into a representation that is tractable to a model-based analysis. This is accomplished by taking the design and converting it into a state transition diagram with Boolean equations that represents the logic that governs the state transitions. The DUT may be developed in a hardware description language (HDL) such as Verilog whereas the verification goals may be developed as SystemVerilog covergroups or SystemVerilog Assertion properties. In some implementations of the present invention, the formal engine may be required to generate a set of expert stimuli examples that feed the GAIL learning process and may not be required to perform a complete analysis.

The HDL may be used by the formal engine to develop a mathematical model that can be used to calculate the response of the DUT to a given stimulus. The verification goals may be used by the formal engine to constrain and thus make feasible the initial stimulus generation process. The formal engine also has the ability to determine what, if any, verification goals are satisfied as a consequence of a stimulus and response pair.

Various types of formal analyses may be performed in the formal engine. For example, model checking and theorem proving may be used to employ formal analyses. However, the present invention is not limited to these examples.

In an exemplary implementation, a formal engine receives one or more goals (e.g., signal level goals, micro-architectural goals, architectural goals, etc.) and a design model (RTL) which models an electronic system with regards to the flow of digital signals (e.g., data) between hardware registers and the logical operations performed on those signals. During training, the formal engine can output training data (e.g., coverage hit or miss, inputs, and outputs). This training data may be segregated such that some of the data (e.g., actual goals achieved) is transmitted to a learner module and some of the other training data (e.g., DUT inputs and outputs) is transmitted to a model (i.e., learning test generator). Accordingly, the learner module receives the actual goals achieved whereas the model receives only the inputs and outputs.

The learner may employ a learning algorithm (e.g., neural network learning algorithm) to aid the learning test generator to reconfigure its parameters to better predict the correct output of actual goals achieved. After each iteration, the learning test generator's parameters optimize to more accurately predict the correct output results as stored in the learner module. After enough iterations, the learning test generator will be able to generate new tests to meet new coverage goals formulated to determine the robustness of a particular electronic system design.

It should be understood by one having ordinary skill in the art that the present invention is not limited to RTL applications but may be applied to any design model at any level of implementation. For example, transaction-level models, gate level net lists, etcetera may be employed as design models in a suitable manner consistent with the present invention.

Figure 7:
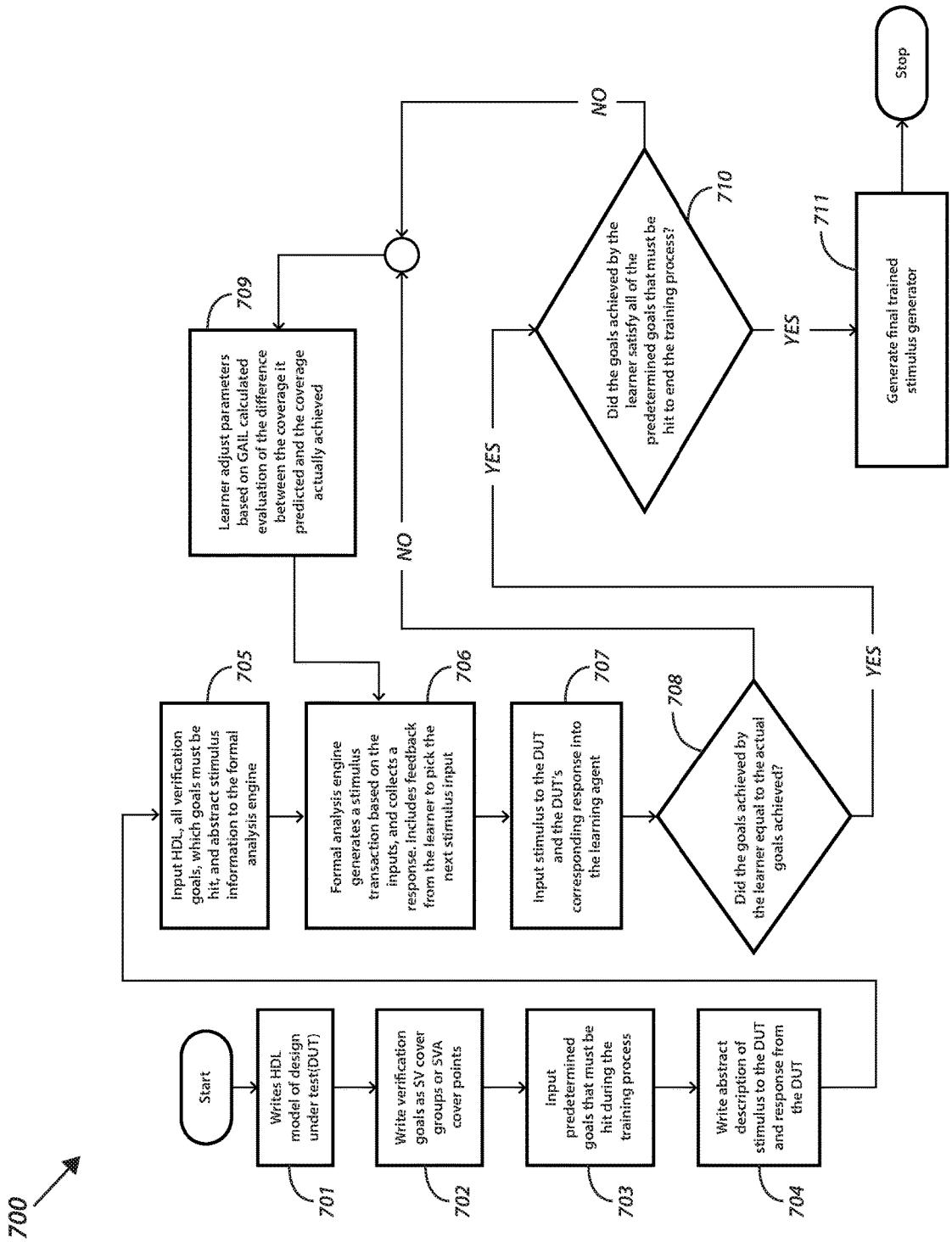
FIG. 7 is an exemplary flowchart for one manner of implementing the present invention.

FIG. 7 is an exemplary flowchart for one manner of implementing the present invention. As shown in the flowchart, the user writes an HDL model of the design under test (DUT). The user may write the verification goals using, for example, SystemVerilog Assertions or SystemVerilog covergroups.

Next, the user identifies which of the set of verification goals must be achieved before training is complete. The user may also write an abstract description at the transaction level of the stimulus used to trigger activity in the DUT in addition to an abstract at the transaction level description of the responses from the design under test as a consequence of the activity triggered by the corresponding stimulus. Afterwards, a formal analysis of the design under test, the coverage goals, and the abstract is performed on the stimulus (e.g., description of stimulus) and response definitions in an iterative fashion until the predetermined subset of the input coverage goals are achieved or a pre-set limit is reached (e.g., on the order of thousands of iterations).

Therefore, a single training stimulus can be generated based on the inputs provided via a formal analysis. The response from the DUT for the applied stimulus is used to determine what, if any, verification goals are achieved both in actuality and as predicted by the learning test generator. The system may also incorporate the current parameterization of the learning test generator, the input stimulus, and the corresponding output responses to predict which goals should be achieved. As a result of the formal analysis, the following can be determined:

Whether the predicted goals achieved by the learning test generator equal to the actual goals achieved? Whether the predicted goals achieved by the learning test generator satisfy all of the predetermined goals that must be achieved to end the training process? If the answer to either question is "no", the parameters that control the prediction mechanism of the learning test generator may be updated based on the GAIL algorithm.

The learner may also be updated to improve the discriminator application internal to its operation. As a function of the of GAIL-learning process, the learning test generator will be re-parameterized to achieve more accurate predictions based on the learning processes encompassed in the GAIL step. Afterwards, the formal engine proceeds to generate the next training stimulus. Alternatively, if both questions result in a "yes", the final parameterized learning test generator will be exported as a SystemVerilog component and integrated into a test bench.

In some implementations, the export process essentially generates the learning test generator in a format that is suitable to be integrated into a conventional test bench. For example, the learning test generator may be exported as a UVM (Universal Verification Methodology) sequencer and integrated into a UVM test bench as depicted in FIG. 8.

The present invention is not limited to any particular format. For example, a Portable Stimulus Working Group (PSWG) format or a C-program with an exportable API interface to a HDL-based simulation may be employed. As known in the art, a PSWG format is a standardized format for expressing stimulus used in design verification. PSWG formats are advantageous over other stimulus formats in that this format enables re-using stimulus from various sources written in PSWG format to produce via combination of the re-used stimulus blocks to create new stimulus in a standardized uniform way. Alternatively, a PSWG format could be implemented as a compiled C program with an API that could be imported into the testbench and used by the testbench to generator stimulus.

Figure 8:
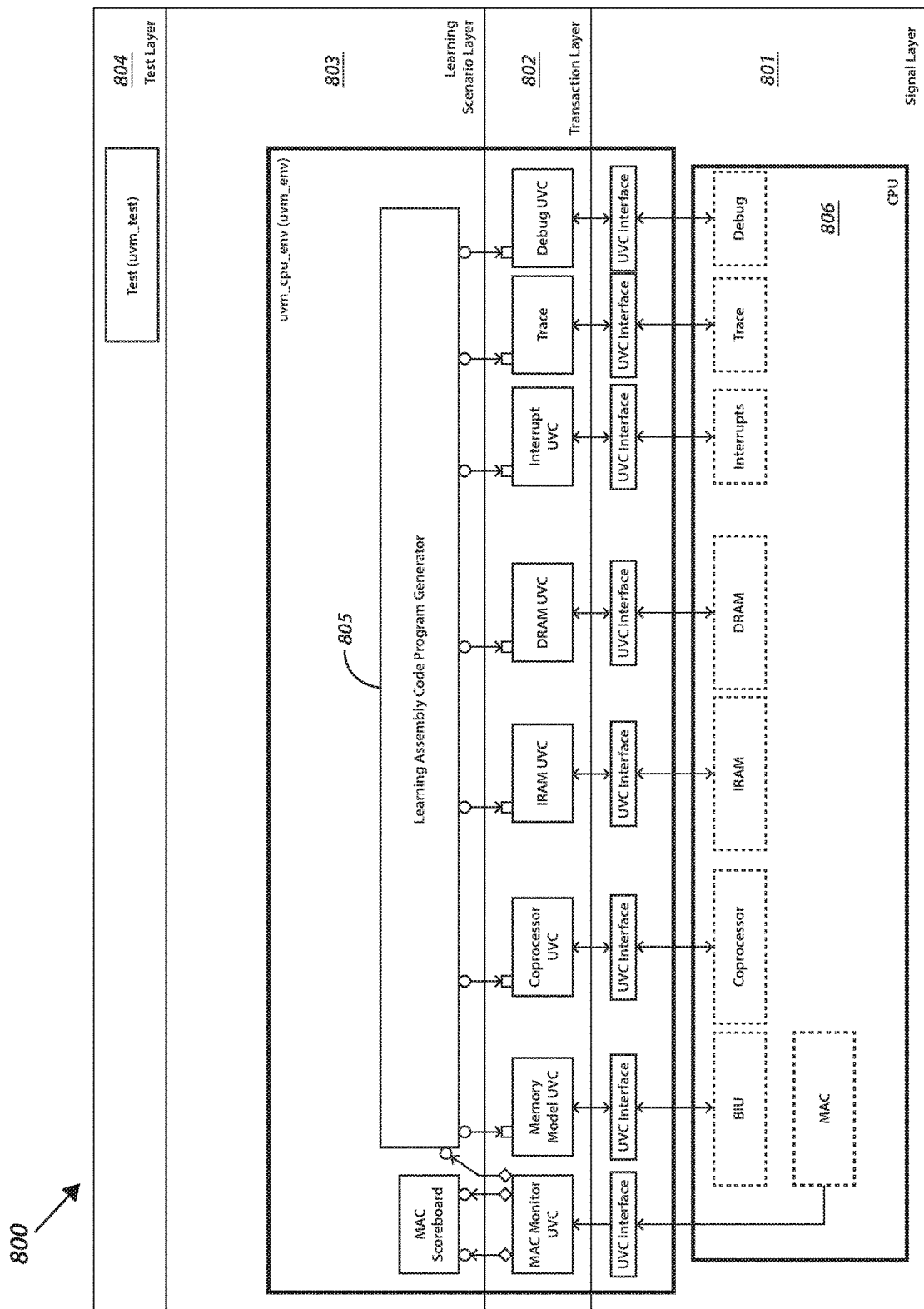
FIG. 8 is an illustration of one embodiment of a manner of using a resultant learning test generator consistent with the present invention.

FIG. 8 is an illustration of a resultant learning test generator consistent with the present invention. In particular, FIG. 8 shows an example of a resultant learning test generator integrated into an industry standard IEEE universal verification methodology test bench.

Figure 9:
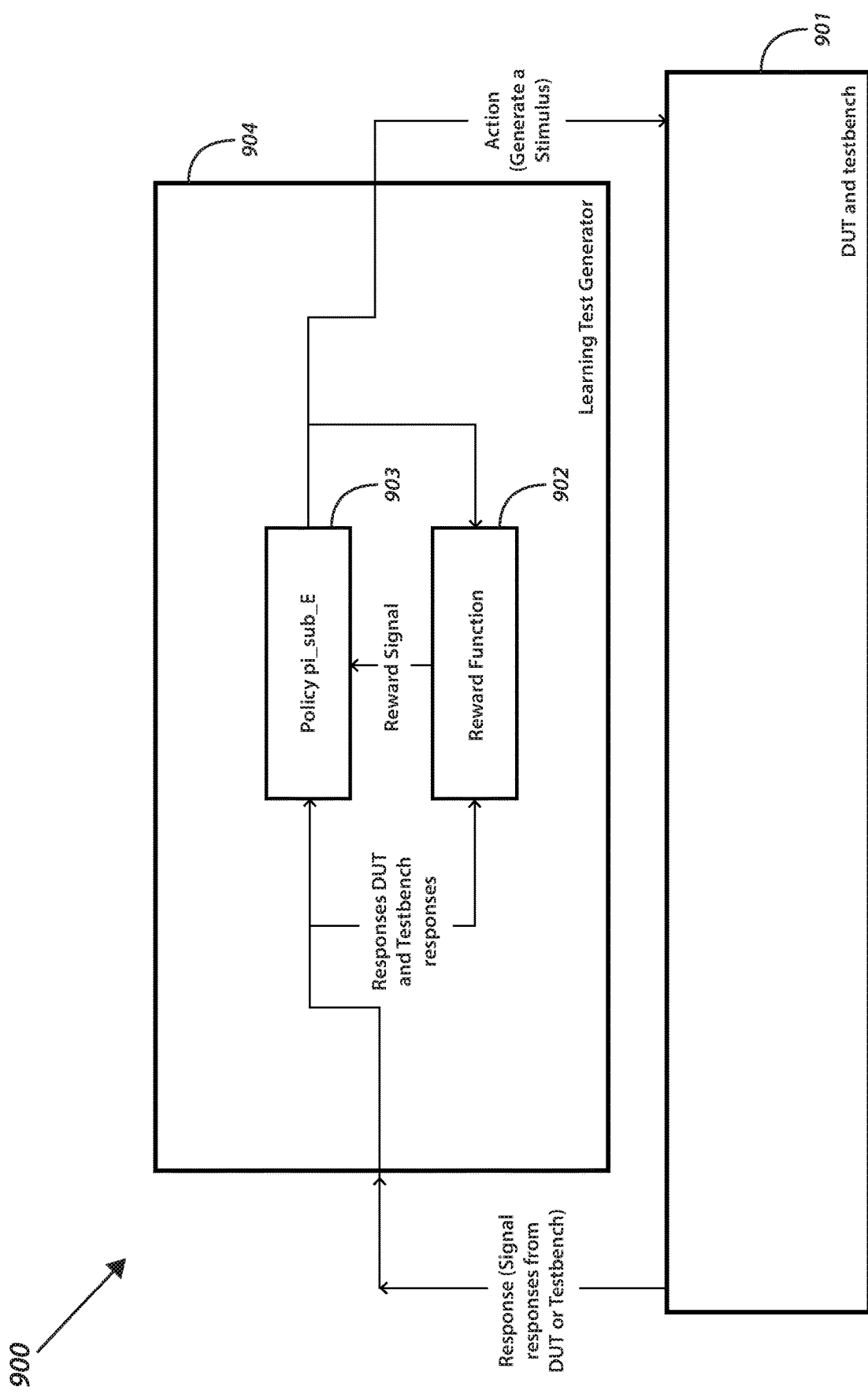
FIG. 9 is an illustration of an internal structure of the post-trained learning test generator according to one embodiment consistent with the present invention.

FIG. 9 is an illustration of an internal structure of the post-trained learning test generator according to one embodiment consistent with the present invention. The learning test generator may be a conventional reinforcement learning agent that was trained according to a training process described herein with an expert policy pi(s,resp,a) and a reward function r(a,resp). The expert policy represents the internal state s action a, and the response resp tuple that governs the type of stimulus and the sequence or order of stimulus generated by the learning test generator.

Figure 10:
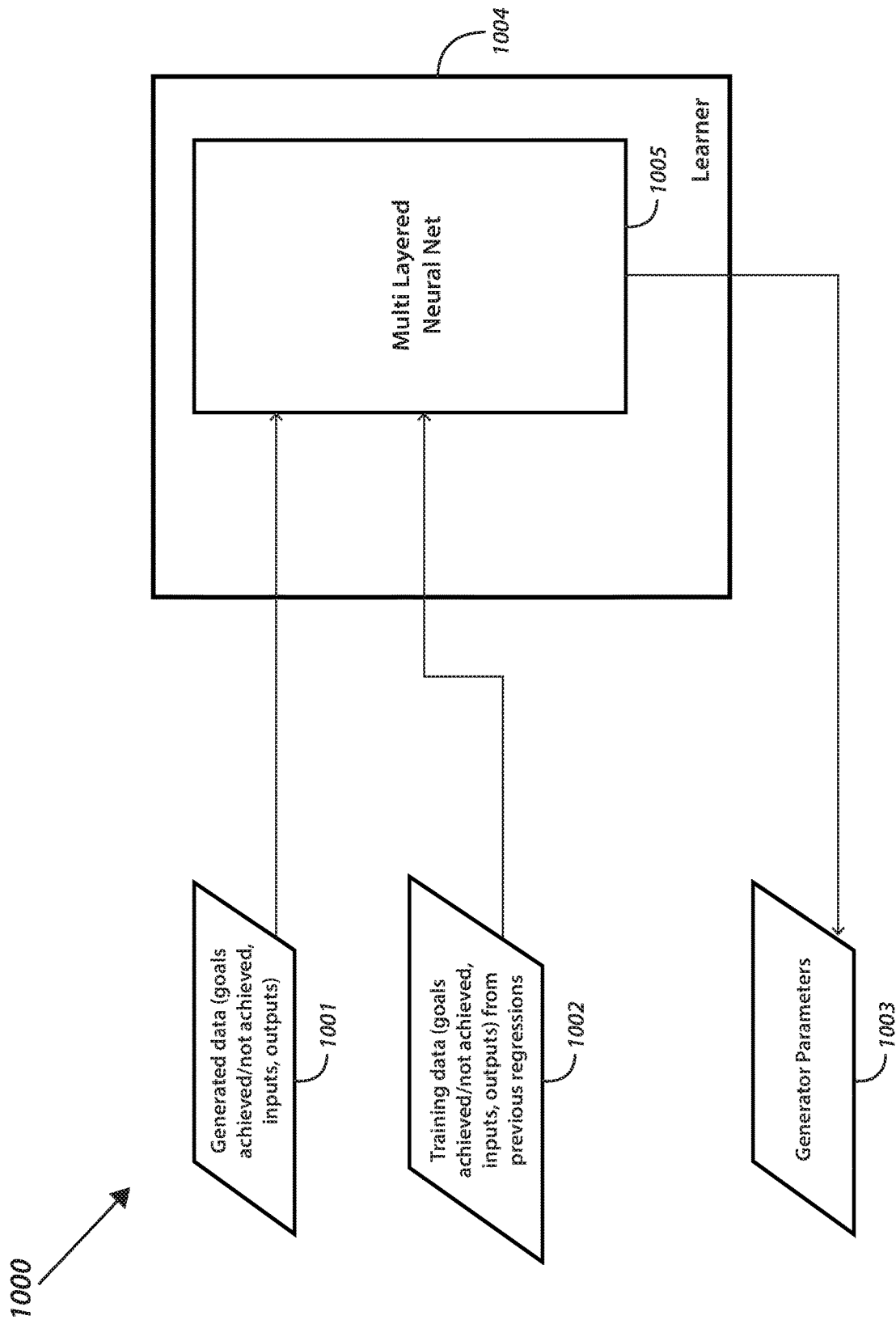
FIG. 10 illustrates an exemplary embodiment of a learner module consistent with the present invention.

FIG. 10 depicts an exemplary embodiment of a learner module consistent with the present invention. As shown, a set of actual goals, predicted goals, and generator parameters are input into a multi-layered neural network implemented by the learner.

Figure 11:
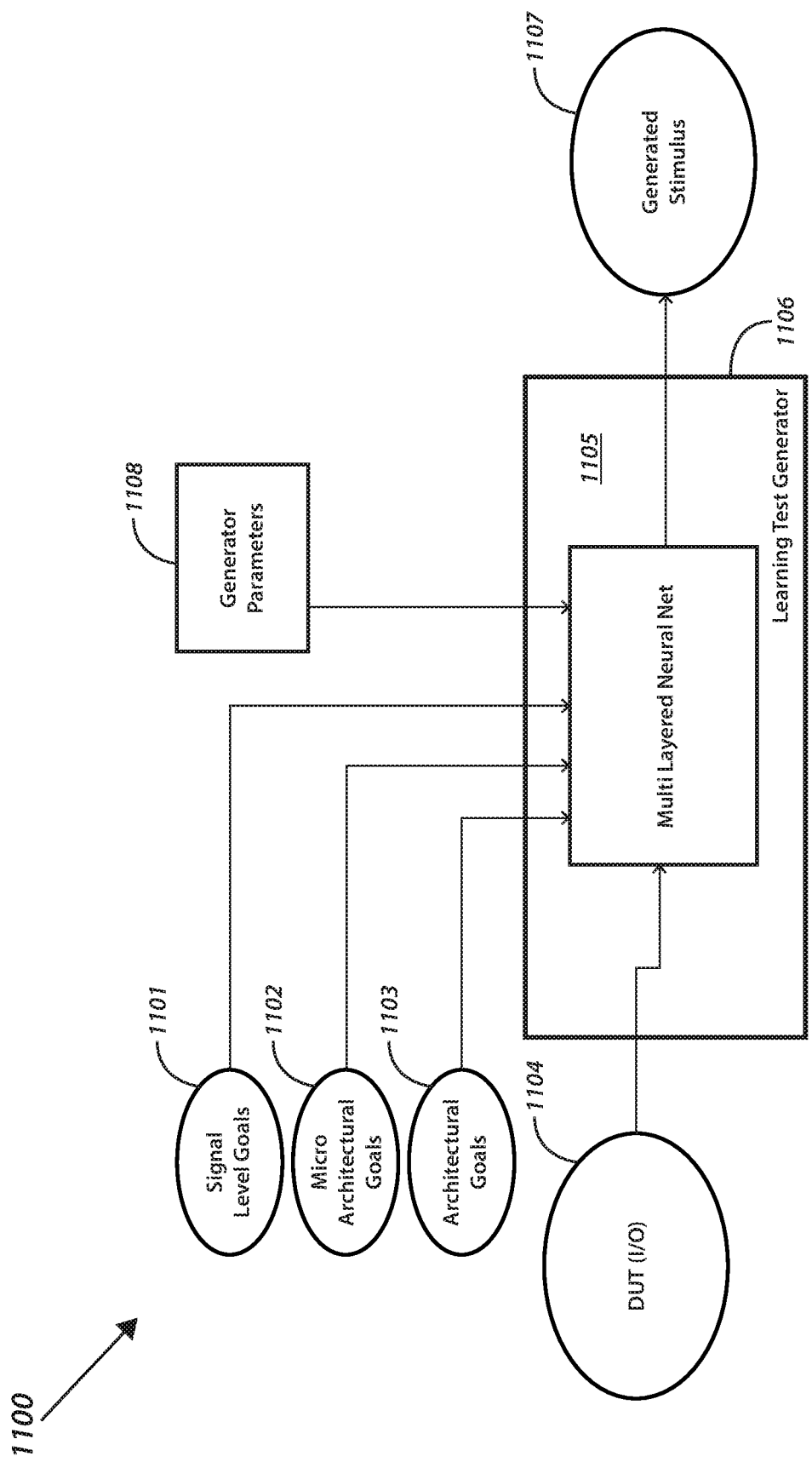
FIG. 11 is an exemplary illustration of an internal operation of a learning test generator in the process of training.

FIG. 11 depicts an exemplary illustration of an internal operation of a learning test generator in the process of a training phase. As described above, the learning test generator is employed as a conventional GAIL-based generator application. The learning test generator creates a prediction based on DUT inputs and outputs ("DUT (I/O))", verification goals, and generator parameters via neural network processing it creates a prediction of which of the verification goals would be achieved from the aforementioned inputs.

Figure 12:
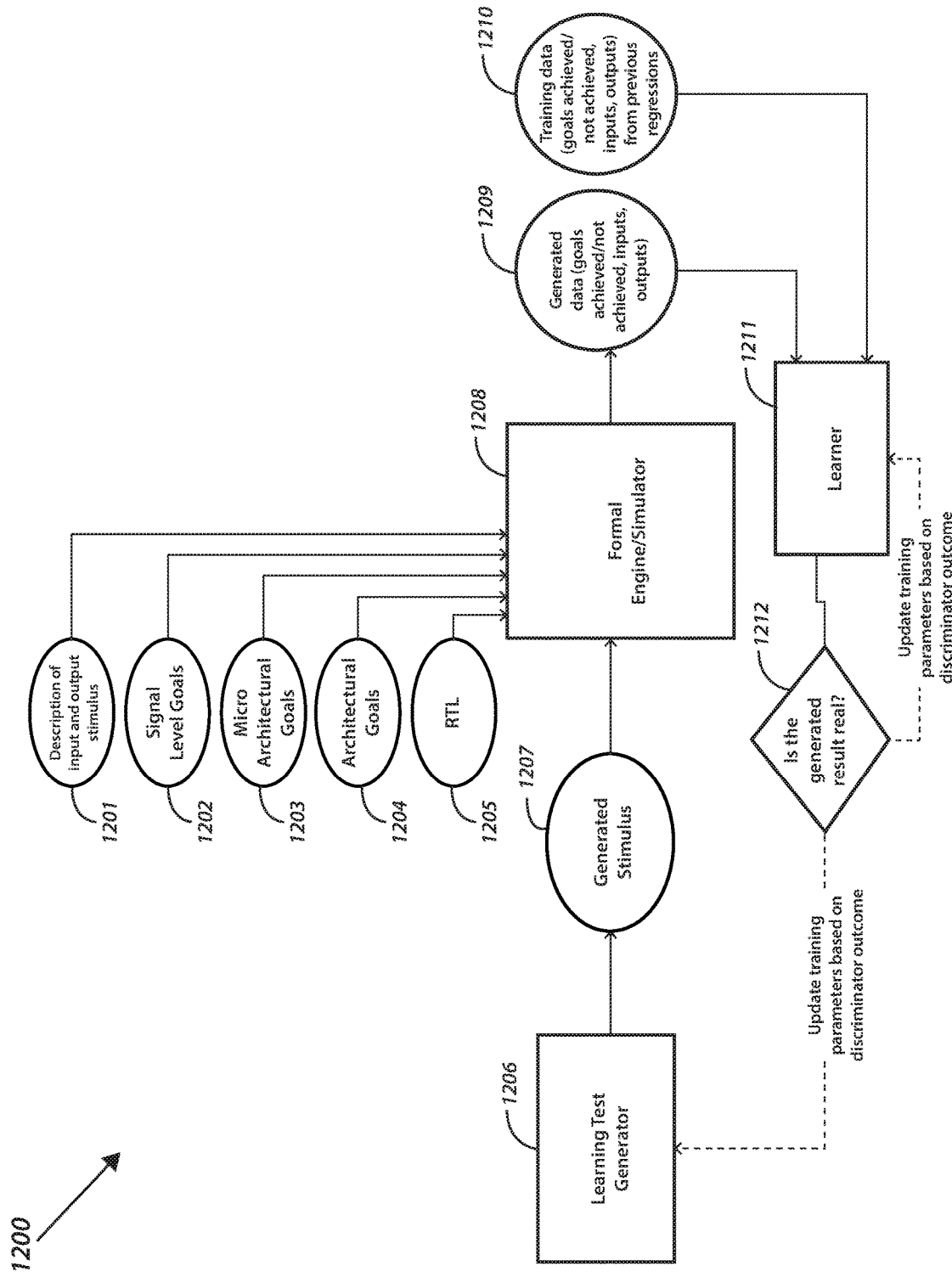
FIG. 12 is an alternative embodiment which depicts a learning process used to generate a learning test generator consistent with the present invention.

FIG. 12 is an alternative embodiment which depicts a learning process used to generate a learning test generator consistent with the present invention. The generated stimulus along with the HDL and verification goals are then input into the formal engine or alternatively to a HDL simulator to produce the resultant generated data. The resultant generated data comprises the original stimulus, the corresponding outputs, and any verification goals that are achieved. The generated data and training data are then inputted into the learner module. In some embodiments, the training data comprises inputs, corresponding outputs, and an indication of any verification goals that were achieved as a consequence of the input/output combination.

The learner module receives the generated data and training data and performs a GAIL discrimination process where it determines whether or not the generated data reflects results that correspond to an expected behavior (i.e., whether the predetermined goals have been achieved). The learner may also generate updates to the parameters that control the operation of the learning test generator and the learner applications.

Figure 13:
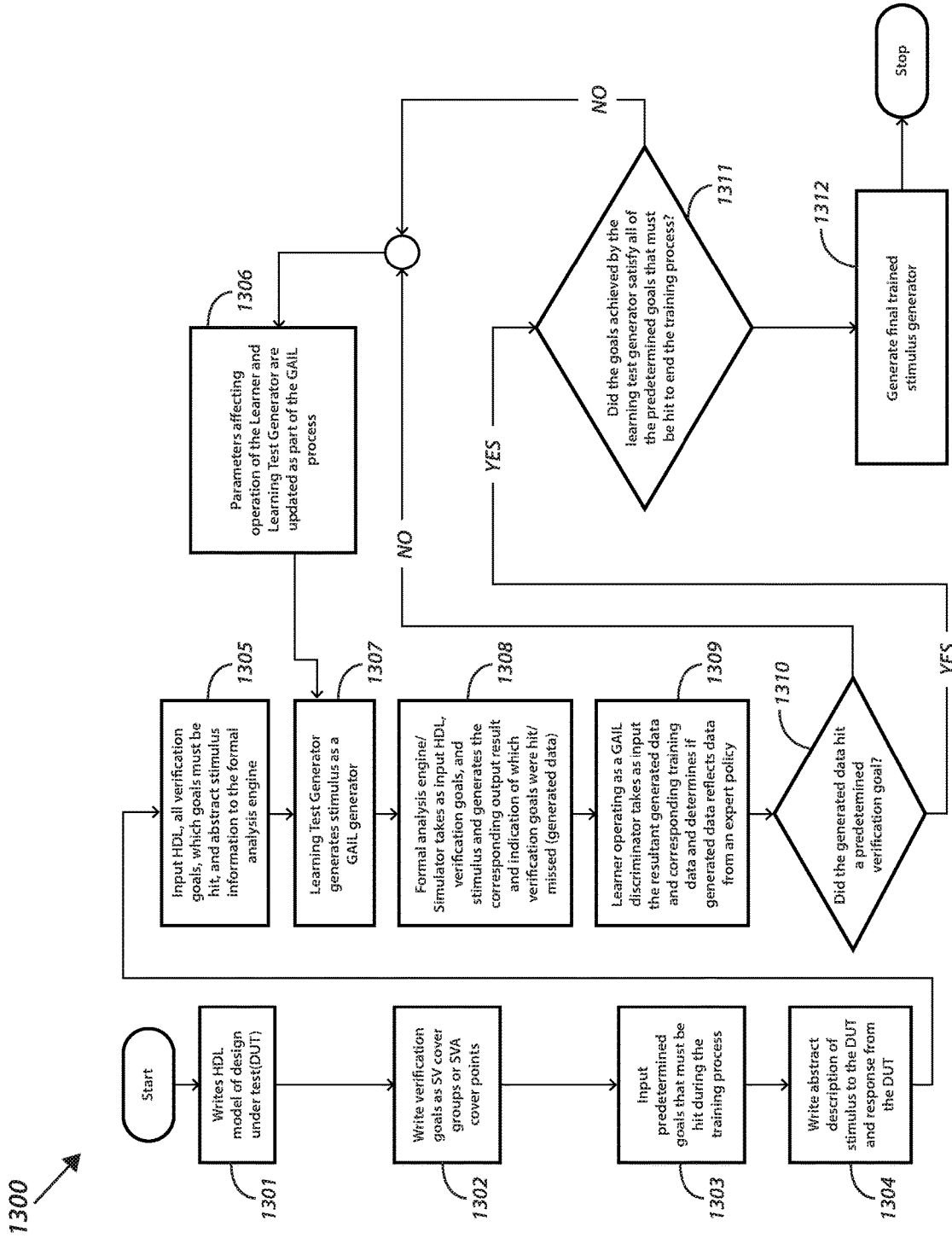
FIG. 13 is an exemplary flowchart which depicts one manner of implementing the learning process described in reference to FIG. 10.

FIG. 13 is an exemplary flowchart which depicts one manner of implementing the learning process described in reference to FIG. 12. In the embodiment depicted in FIG. 13, the learning test generator directly creates stimulus. In addition, the learner performs GAIL discrimination between the (input, output, goals achieved) tuple from the simulation of a stimulus of the learning test generator and a record of previous (input, output, goals achieved) tuples from a prior simulation of the RTL design. Specifically, in this embodiment, the learning test generator generates stimulus purely as a GAIL generator.

Figure 14:
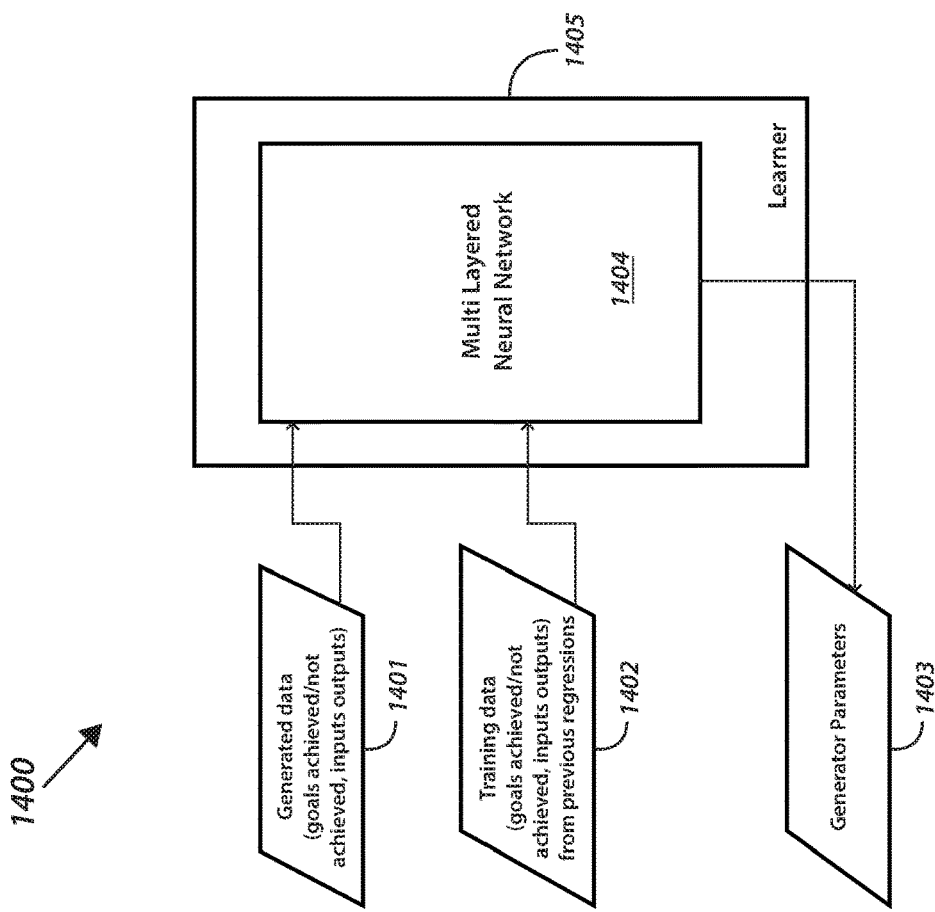
FIG. 14 is a depiction of an internal structure of a learner according to an embodiment of the present invention.

FIG. 14 is a depiction of an internal structure of a learner according to an embodiment of the present invention. In particular, the embodiment depicted receives as inputs generated data (e.g., goals achieved per the generated stimulus, the generated stimulus itself, and the DUT responses to that generated stimulus), and training data (e.g., goals actually achieved, inputs actually generated, and DUT responses actually made) from prior simulations which is used to update the generator parameters.

The neural network governing the operation of the learner application in the embodiment disclosed in FIG. 14 is very similar to the learner application described in reference to other embodiments. However, the learner described in the present embodiment differ in structure and configuration. The differences enable the learner to operate on the different inputs, but it's operation will be the same, namely as the conventional discriminator in a GAIL-based learning process.

Figure 15:
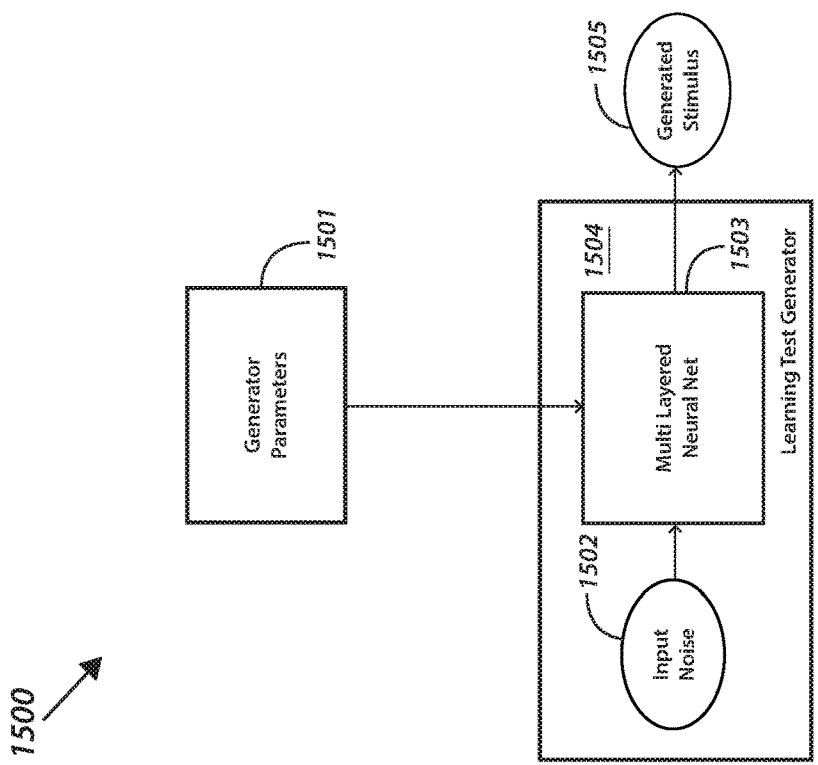
FIG. 15 is an illustration of another exemplary embodiment of an internal operation of a learning test generator during a learning process.

FIG. 15 is an illustration of another exemplary embodiment of an internal operation of a learning test generator during a learning process according to one embodiment of the present invention. Notably, the learning process associated with this embodiment generates stimulus from a multi-layered neural network (e.g., de-convolutional neural network or similarly functioning other type of neural network) based on input noise of a certain distribution (e.g., Gaussian distribution).

Figure 16:
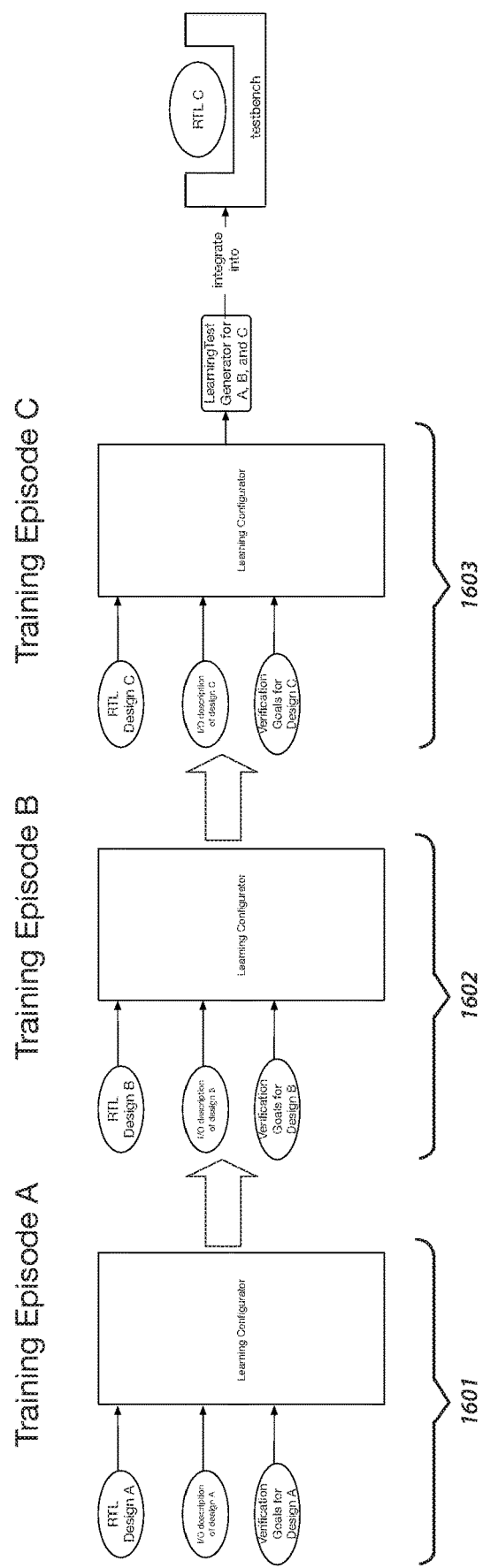
FIG. 16 is an illustration of an embodiment for transfer learning.

FIG. 16 is an illustration of an embodiment for transfer learning. Transfer learning may be characterized as a process by which a learning test generator (e.g., pre-trained learning test generator) can be trained on two or more designs. The training process may be accomplished by a series of training processes 1601, 1602, and 1603, wherein the pre-trained learning test generator is trained on a single design in each process. As a result of these training processes, the pre-trained learning test generator can gain the ability to generate tests to achieve all of the functional goals for all designs that are provided as input as part of the overall transfer learning process. In some embodiments, the pre-trained learning test generator may be employed as universal, global, and non-proprietary that's trained on a host (e.g., >50,000 systems) of electronic system designs. The pre-trained test generator may be available online in an open-source environment.

This process will create several advantages. For example, training on a given design in a given process subsequent to the first process may take less time than if the training for that same design were accomplished without any prior transfer learning. In addition, the process provides the ability for a learning test generator to generate stimulus for any given design to achieve all verification goals for a specific design. Specifically, the amount of time and/or the amount of test generation required to achieve these goals may be improved.

There are many different algorithms that can be employed to govern the transfer learning process disclosed in the present invention. Exemplary transfer learning algorithms include, but are not limited to, case-based re-enforcement learning, strategy transfer based algorithms, and relational re-enforcement learning. Furthermore, the family of transfer learning algorithms may include both algorithms that require as input a task mapping and algorithms that do not. The present invention is amenable to employ any of several algorithms that can govern the creation of these task mappings. Exemplary task-mapping creation algorithms include qualitative dynamic Bayes networks, the AtEase algorithm, and the MASTER algorithm.

Figure 17:
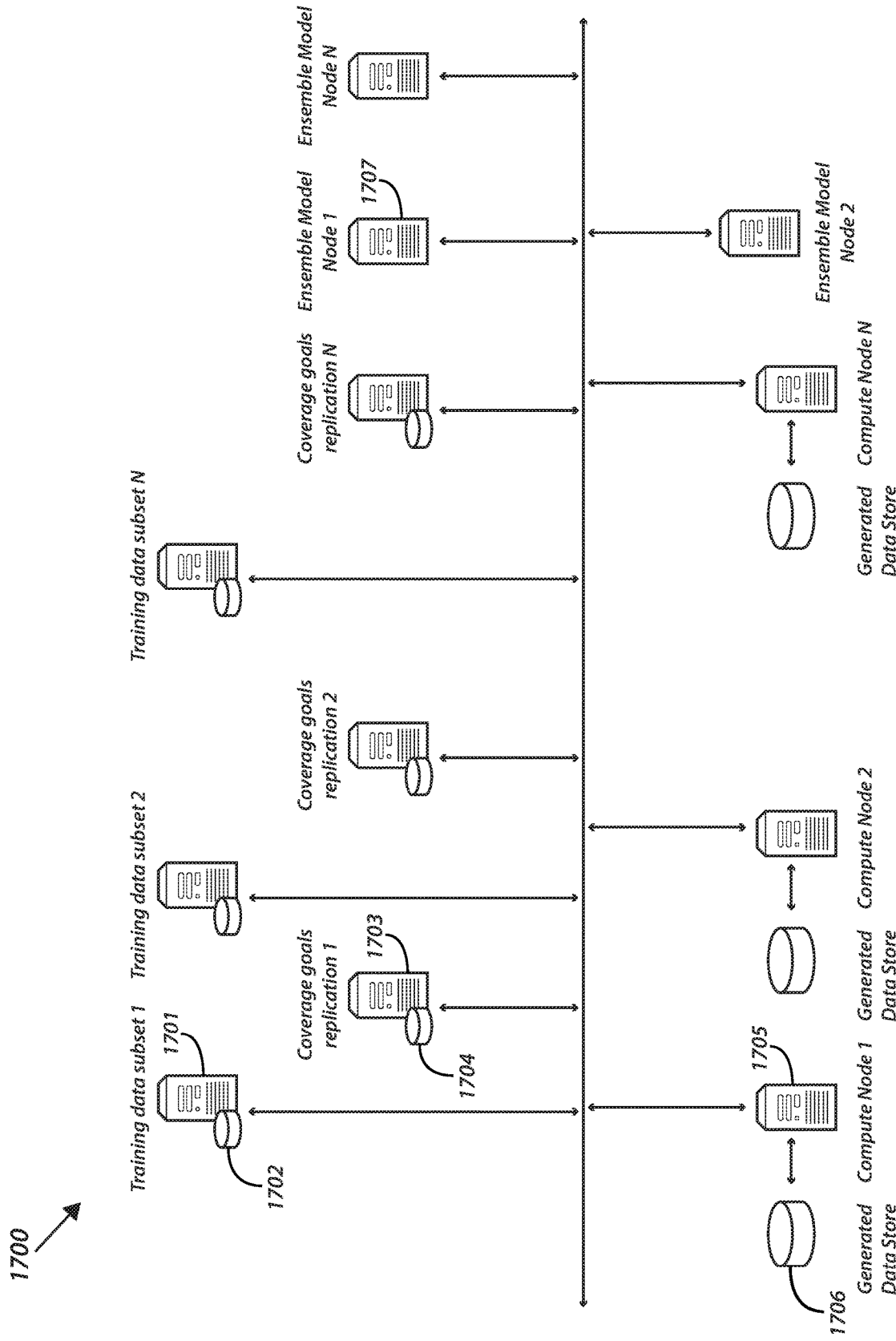
FIG. 17 is an illustration of a distributed learning model consistent with the present invention.

FIG. 17 is an illustration of a distributed learning model 1700 consistent with the present invention. Distributed learning may be characterized as a process by which a learning test generator can be trained by employing several computing devices in parallel which work together to implement the learning process described in reference to FIG. 12. In some embodiments, a distributed learning method consistent with the present invention employs one or more storage devices wherein each storage device 1701 holds a subset of the training data 1702 and replicates in its entirety the coverage goals 1704 (contained in storage device 1703).

The distributed learning model 1700 includes compute nodes 1705 each of which implements the learning process operating on its corresponding subset of training data and coverage goals and stores its respective generated data 1706 onto the storage device 1705. The distributed learning processes may employ additional ensemble model servers 1707 which may depend on the type of distributed learning algorithmic framework employed in the overall distributed learning process.

The distributed learning process creates several advantages. Using distributed learning with multiple computing devices can enable the learning process to achieve greater accuracy on large data sets than if only a single computing device were employed to implement the learning process. Distributed learning enables the learning process to train itself without being limited by the computer speed, stability, or storage capability of a single computing device.

There are many different algorithms and compute frameworks that can be employed to govern the distributed learning process. Exemplary distributed learning algorithms include, but are not limited to, distributed boosting, stacked generalization, and meta-learning. Exemplary distributed learning compute frameworks include, but are not limited to, SimsSQL, SystemML, and Spark.

Reference throughout this specification to "one embodiment" or "an embodiment" means that a particular feature, structure, or characteristic described in connection with the embodiment is included in at least one embodiment of the present disclosure. Thus, the appearances of the phrases "in one embodiment" or "in some embodiments" in various places throughout this specification are not necessarily all referring to the same embodiment. Furthermore, the particular features, structures, or characteristics may be combined in any suitable manner in one or more embodiments.

In the foregoing specification, a detailed description has been given with reference to specific exemplary embodiments. It will, however, be evident that various modifications and changes may be made thereto without departing from the broader spirit and scope of the disclosure as set forth in the appended claims. The specification and drawings are, accordingly, to be regarded in an illustrative sense rather than a restrictive sense. Furthermore, the foregoing use of embodiment and other exemplarily language does not necessarily refer to the same embodiment or the same example, but may refer to different and distinct embodiments, as well as potentially the same embodiment.

What is claimed is:

1. A non-transitory computer readable medium contained within a hardware comprising a processor and containing, instructions that when executed causes a machine to:
   receive, at the formal engine, input of a first design, a set of verification goals, a set of predetermined goals, and a description of input and output stimuli;
   implement a learning process, comprising:
      create, via the formal engine, training data;
      transmit the training data to a pre-trained learning test generator and to a learner, wherein the pre-trained learning test generator application functions as a generator in a GAIL-based training mode and as a traditional RL-based agent to generate stimulus in a simulation environment;
      wherein the pre-trained learning test generator is pre-trained on a plurality of electronic system designs that are different than the first design;
      create a set of predicted goals;
      transmit the predicted goals to the leaner;

employ the learner to update the generator parameters that are associated with the pre-trained learning test generator to improve the prediction outcomes outputted by the pre-trained learning test generator;

employ the learner to update the learning parameters that are associated with the learner to improve an evaluation of the predictions created by the pre-trained learning test generator; and repeat the learning process until the set of predicted goals matches the set of predetermined goals.

2. The non-transitory machine-readable storage medium of claim 1, wherein the training data comprises Design Under Test inputs and Design Under Test outputs.

3. The non-transitory machine-readable storage medium of claim 1, wherein the verification goals are expressed as SystemVerilog Cover Groups or SystemVerilog assertions.

4. The non-transitory machine-readable storage medium of claim 1, wherein the set of predicted goals are created by the pre-trained learning test generator.

5. The non-transitory machine-readable storage medium of claim 1, wherein the pre-trained learning test generator is tested on greater than 50,000 electronic system designs.

6. A computer expansion card, comprising:
a non-transitory computer readable medium containing instructions that when executed causes a machine to:
receive, at the formal engine, input of a design, a set of verification goals, and a description of input and output stimuli;
implement a learning process, comprising:
create, via formal engine, training data;
transmit the training data to a pre-trained learning test generator and to a learner;
create a set of predicted goals;
transmit the predicted goals to the leaner, wherein the learner functions as a generator in a GAIL-based training mode and as a traditional RL-based agent to generate stimulus in a simulation environment;
employ the learner to update the generator parameters that are associated with the pre-trained learning test generator to improve the prediction outcomes outputted by the pretrained learning test generator;
employ the learner to update the learning parameters that are associated with the learner to improve an evaluation of the predictions created by the pre-trained learning test generator; and
repeat the learning process until the set of predicted goals matches the set of verification goals.

7. The computer expansion card of claim 6, wherein the computer expansion card is a personal computer card.

8. The computer expansion card of claim 6, wherein the computer expansion card is a graphics card.

9. The computer expansion card of claim 6, wherein the formal engine is operable to perform model checking formal analysis or a theorem proving formal analysis.

* * * * *